United States Patent
Havlik et al.

(10) Patent No.: US 10,691,361 B2
(45) Date of Patent: Jun. 23, 2020

(54) MULTI-FORMAT PIPELINED HARDWARE DECOMPRESSOR

(71) Applicant: Microsoft Technology Licensing, LLC, Redmond, WA (US)

(72) Inventors: Robert W. Havlik, Fort Collins, CO (US); Michael J. Erickson, Fort Collins, CO (US); Derek E. Gladding, Pacifica, CA (US); Amar Vattakandy, Longmont, CO (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 10 days.

(21) Appl. No.: 15/640,079

(22) Filed: Jun. 30, 2017

(65) Prior Publication Data
US 2018/0246645 A1    Aug. 30, 2018

Related U.S. Application Data

(60) Provisional application No. 62/463,541, filed on Feb. 24, 2017.

(51) Int. Cl.
*G06F 3/06*    (2006.01)
*H03M 7/30*    (2006.01)

(52) U.S. Cl.
CPC ............ *G06F 3/064* (2013.01); *G06F 3/0608* (2013.01); *G06F 3/0656* (2013.01);
(Continued)

(58) Field of Classification Search
CPC ...... G06F 3/0608; G06F 3/0619; G06F 3/064; G06F 3/0656; G06F 3/0673;
(Continued)

(56) References Cited

U.S. PATENT DOCUMENTS 4,053,871 A    10/1977  Vidalin et al.
4,384,291 A    5/1983   Lewis et al.
(Continued)

FOREIGN PATENT DOCUMENTS

WO    9827720 A1    6/1998

OTHER PUBLICATIONS

Nabina, et al., "Dynamic Reconfiguration Optimisation with Streaming Data Decompression", In Proceedings of the International Conference on Field Programmable Logic and Applications, Aug. 31, 2010, pp. 602-607.
(Continued)

*Primary Examiner* — Zhuo H Li
(74) *Attorney, Agent, or Firm* — Alleman Hall Creasman & Tuttle LLP

(57) ABSTRACT

Data compression schemes may indicate the length of the compressed data block in a header or in the compressed data itself. If the start and end of the data block are known before the decoding process has completed by the decoding stage, a header processing stage can 'skip ahead' to the start of the next block to begin processing the header of the next block while the current block is still being decoded. Thus, the header processing stage and the decoding stage are operated concurrently. If the end of the compressed block is indicated in the compressed data itself the end of the data block is not known until the end of the compressed data block is reached. For these types of compressed data blocks, the header processing stage waits until the decoding stage finishes with the preceding block before processing the header of the current block.

11 Claims, 11 Drawing Sheets

(52) U.S. Cl.
CPC ............ *G06F 3/0673* (2013.01); *H03M 7/30* (2013.01); *H03M 7/6029* (2013.01)

(58) Field of Classification Search
CPC ..... G06F 3/0661; H03M 7/6005; H03M 7/30; H03M 7/6029; H04L 69/04
See application file for complete search history.

(56) References Cited

U.S. PATENT DOCUMENTS

| | | | |
|---|---|---|---|
| 5,699,117 A * | 12/1997 | Uramoto | H04N 19/70 348/390.1 |
| 5,703,793 A | 12/1997 | Wise et al. | |
| 5,956,519 A | 9/1999 | Wise et al. | |
| 6,112,017 A | 8/2000 | Wise | |
| 6,591,384 B1 | 7/2003 | Chou | |
| 7,243,165 B2 | 7/2007 | Kravec et al. | |
| 8,599,841 B1 | 12/2013 | Sriram | |
| 8,933,824 B1 | 1/2015 | Agarwal et al. | |
| 9,159,114 B2 * | 10/2015 | Dewangan | G06T 1/20 |
| 9,329,871 B2 | 5/2016 | MacInnis et al. | |
| 10,230,392 B2 * | 3/2019 | Gopal | H03M 7/40 |
| 2005/0243818 A1 | 11/2005 | Foglar et al. | |
| 2009/0232482 A1 * | 9/2009 | Ju | H04N 5/85 386/334 |
| 2012/0045139 A1 * | 2/2012 | Demidov | H03M 7/6088 382/233 |
| 2013/0099947 A1 * | 4/2013 | Dickie | H03M 7/4037 341/59 |
| 2013/0290646 A1 | 10/2013 | Greenwood et al. | |
| 2014/0156790 A1 * | 6/2014 | Gopal | H03M 7/3086 709/217 |
| 2018/0081591 A1 | 3/2018 | Maheshwari et al. | |
| 2018/0173642 A1 * | 6/2018 | Vattakandy | H03M 7/6023 |
| 2020/0091916 A1 | 3/2020 | Haraden et al. | |

OTHER PUBLICATIONS

"Non Final Office Action Issued in U.S. Appl. No. 15/609,759", dated Mar. 22, 2019, 08 Pages.

"Non Final Office Action Issued in U.S. Appl. No. 15/640,146", dated May 1, 2019, 05 Pages.

* cited by examiner

MULTI-FORMAT PIPELINED HARDWARE DECOMPRESSOR

RELATED APPLICATIONS

This application claims the benefit of U.S. Provisional Application Ser. No. 62/463,541, filed Feb. 24, 2017, the contents of which are incorporated herein by reference in its entirety for all purposes.

BACKGROUND

In the field of data processing systems, it is desirable to reduce the size of data files to conserve memory, storage space, and to more efficiently utilize transmission bandwidth. Data compression is often employed to reduce the size of data. In particular, entropy (e.g., Huffman) and Lempel-Ziv (LZ) data compression techniques are the basis for many modern compression standards.

SUMMARY

Examples discussed herein relate to An integrated circuit, comprising: a plurality of block pipeline stages to decompress blocks of compressed data, a first type of compressed block being encoded according to a first compression scheme, a second type of compressed block being encoded according to a second compression scheme; a first block pipeline stage of the plurality of block pipeline stages to operate to extract block information from blocks of compressed data, the block information for the first compression scheme indicating end of block locations, the end of block locations for the second compression scheme not being indicated in the block information for the second compression scheme; and, a second block pipeline stage of the plurality of block pipeline stages to operate to decode compressed data blocks based on respective extracted block information, based at least in part on a first compressed block being encoded according to the first compression scheme, the first block pipeline stage to extract second block information from a second compressed block concurrently with the second block pipeline stage decoding compressed data from the first compressed block.

In another example, an integrated circuit decompresses a plurality of data blocks compressed using a respective plurality of data compression schemes. The integrated circuit includes a buffer, a header processor, and a symbol data decoder. The buffer receives a bitstream comprised of a first compressed data block and a second compressed data block. The first compressed data block comprises, according to a first data compression scheme, a first header portion and a first compressed data portion. The second compressed data block comprises, according to a second data compression scheme, a second header portion and a second compressed data portion. The header processor receives, from the buffer, the first header portion and the second header portion. The symbol data decoder receives, from the buffer, the first compressed data portion and the second compressed data portion. The buffer determines, based at least in part on the first compression scheme, whether the second header portion is to be provided to the header processor before the symbol data decoder has completed decoding the first compressed data portion.

In another example, a method of operating an integrated circuit includes receiving a bitstream of compressed data. The bitstream includes a first block of compressed data and a second block of compressed data. The first block of compressed data has been compressed in accordance with a first data compression scheme. The second block of compressed data has been compressed in accordance with a second data compression scheme. The first block includes a first header and first compressed data. The second block includes a second header and second compressed data. The method includes extracting first information to be used to decompress the first compressed data from the first header. Based at least in part on the first information, it is determined whether to extract second information to be used to decompress the second compressed data before the end of the first compressed data has been decoded using the first information.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

In order to describe the manner in which the above-recited and other advantages and features can be obtained, a more particular description is set forth and will be rendered by reference to specific examples thereof which are illustrated in the appended drawings. Understanding that these drawings depict only typical examples and are not therefore to be considered to be limiting of its scope, implementations will be described and explained with additional specificity and detail through the use of the accompanying drawings.

DETAILED DESCRIPTION OF THE EMBODIMENTS

Examples are discussed in detail below. While specific implementations are discussed, it should be understood that this is done for illustration purposes only. A person skilled in the relevant art will recognize that other components and configurations may be used without parting from the spirit and scope of the subject matter of this disclosure. The implementations may be a machine-implemented method, a computing device, or an integrated circuit.

Due to data dependent compression ratios, many data compression schemes produce variable size compressed data blocks from fixed size input blocks. In order to decompress these variable sized blocks, the end of one block must be found before the decompression of the next block can begin. In an embodiment, each stage of a block level decompression pipeline works on data associated with a single data block at a time. These stages include a header processing stage that extracts the information that is needed to decompress a block from the compressed data stream. The stages also include a decode processing stage that uses the extracted information to decode the rest (i.e., non-header) portions of the compressed data.

Some data compression schemes indicate the length of the compressed data block in a header. In this case, the start and end of the data block are known before the decoding process has completed by the decoding stage. This allows the header processing stage to 'skip ahead' to the start of the next block to begin processing the header of the next block while the current block is still being decoded. In other words, the header processing stage and the decoding stage are operated concurrently. Other data compression schemes indicate the end of the compressed block in the compressed data itself. In this case, the end of the data block is not known until the end of the compressed data block is reached. For these types of compressed data blocks, the header processing stage waits until the decoding stage finishes with the preceding block before processing the header of the current block.

Figure 1A:
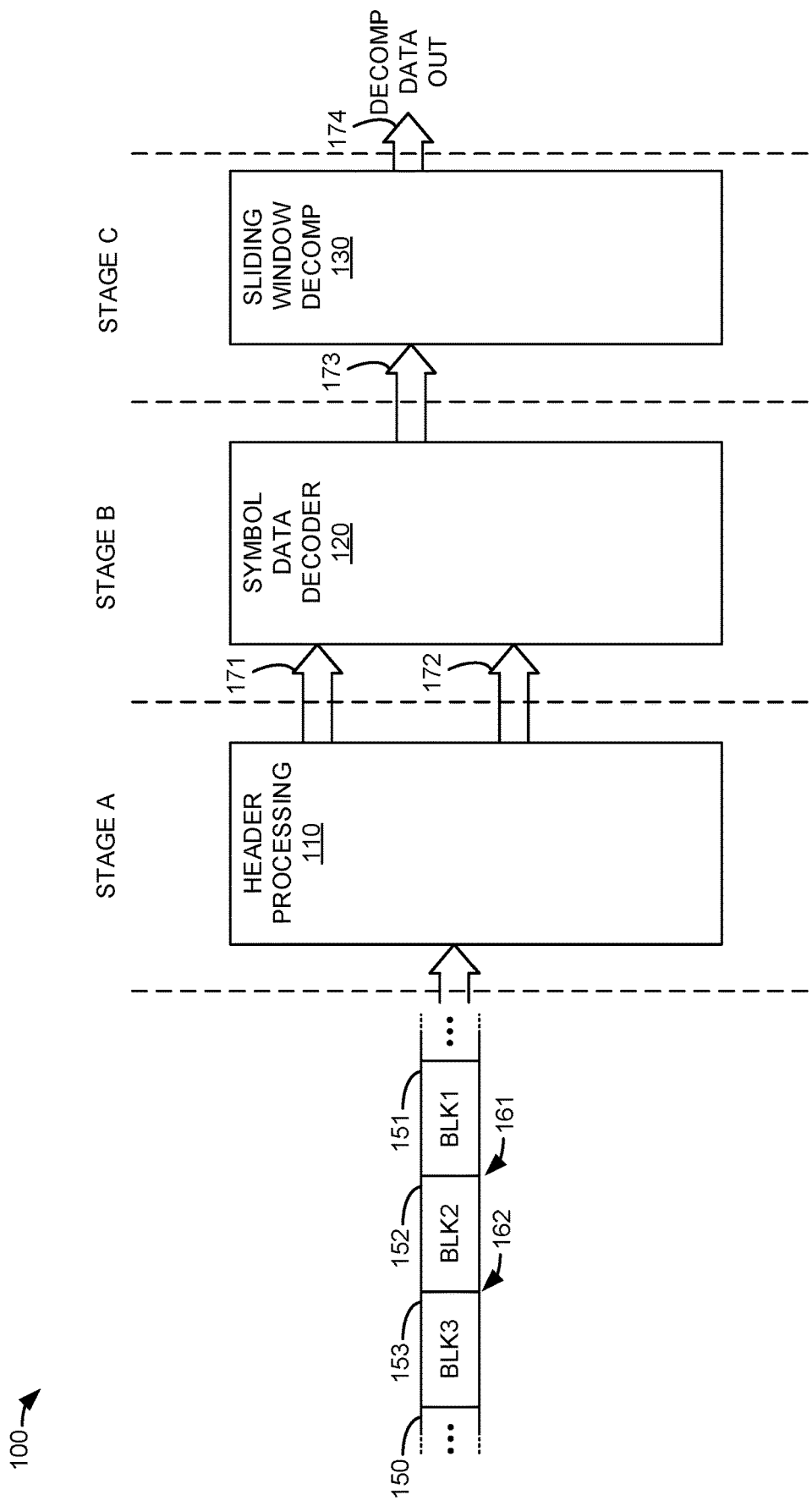
FIG. 1A is a block diagram of block pipeline stages to decompress blocks of compressed data.

FIG. 1A is a block diagram of block pipeline stages to decompress blocks of compressed data. In FIGS. 1A-1E, decompression system 100 includes header processing 110, symbol data decoder 120, and sliding window decompression 130. Header processing is part of block pipelines stage A. Symbol data decoder 120 is part of block pipeline stage B. Sliding window decompression 130 is part of block pipeline stage C.

Each block pipeline stage A-C processes data associated with a single compressed data block at a time. Each pipeline stage A-C may be working on different compressed data blocks from one or more of the other pipelines stages A-C. The compressed data blocks processed by pipeline stages A-C may be parts of different frames. In an embodiment, compression schemes that are frame based as well as compression schemes that are block-based may be decompressed by system 100. Frame level information is effectively converted to block level information and treated as block level information for the remainder of the frame (but held constant for the duration of the frame).

In FIG. 1A, a compressed bitstream 150 is supplied to header processing 110. Compressed bitstream 150 comprises compressed data block 151 (BLK1), compressed data block 152 (BLK2), and compressed data block 153 (BLK3). Compressed data block 151 ends, and compressed data block 152 begins, at location 161 in bitstream 150. Compressed data block 152 ends, and compressed data block 153 begins, at location 162 in bitstream 150. As discussed herein, each of stages A-C may be concurrently operating on different compressed data blocks 151-153. Thus, while stage C is processing (e.g., decompressing) compressed data block 151, stage B may be processing (e.g., decoding) compressed data block 152, and stage A may be processing (i.e., extracting, decoding, and/or decompressing header information) from compressed data block 153.

Header processing 110 extracts block information from the headers in compressed data blocks 151-153. Header processing provides the block information 171 (e.g., Huffman tables, type of compression scheme, etc.) to symbol data decoder 120. Header processing 110 also provides compressed data 172 (with the header removed) to symbol data decoder 120. Header processing 110 may also provide replay functionality to re-provide at least part of the compressed data 172 to symbol data decoder 120. Header processing 110 may re-provide a part of compressed data 172 when, for example, part of the header was sent to symbol data decoder 120. In another example, header processing 110 may re-provide a part of compressed data 172 when part of the compressed data was sent to another part of header processing 110.

Symbol data decoder 120 uses block information 171 to parse and decode symbols 173 out of compressed data 172. Symbol data decoder 120 provides the decoded symbols 173 to sliding window decompression 130. Sliding window decompression outputs the decompressed data 174.

In an embodiment, block information 171 includes the location of the end of the header and the location that the compressed data ends (i.e., end of compressed block.) Since the end of the header is known, the compressed data portion of the block can be queued for decoding while the header for that block is being processed (which may take hundreds of cycles.) Once the header is decoded, decoding of the block may begin.

In an embodiment, block information 171 includes the location that the compressed data ends (i.e., end of compressed block) but not the location of the end of the header. In this case, decoding the header for the next compressed data block can begin as soon data from the start of the next compressed data block is received. In an embodiment, block information 171 includes neither the location that the compressed data ends (i.e., end of compressed block) or the location of the end of the header. In this case, the compressed data portion of the block needs to be decoded before header processing 110 can begin working on the next compressed data block.

Figure 1B:
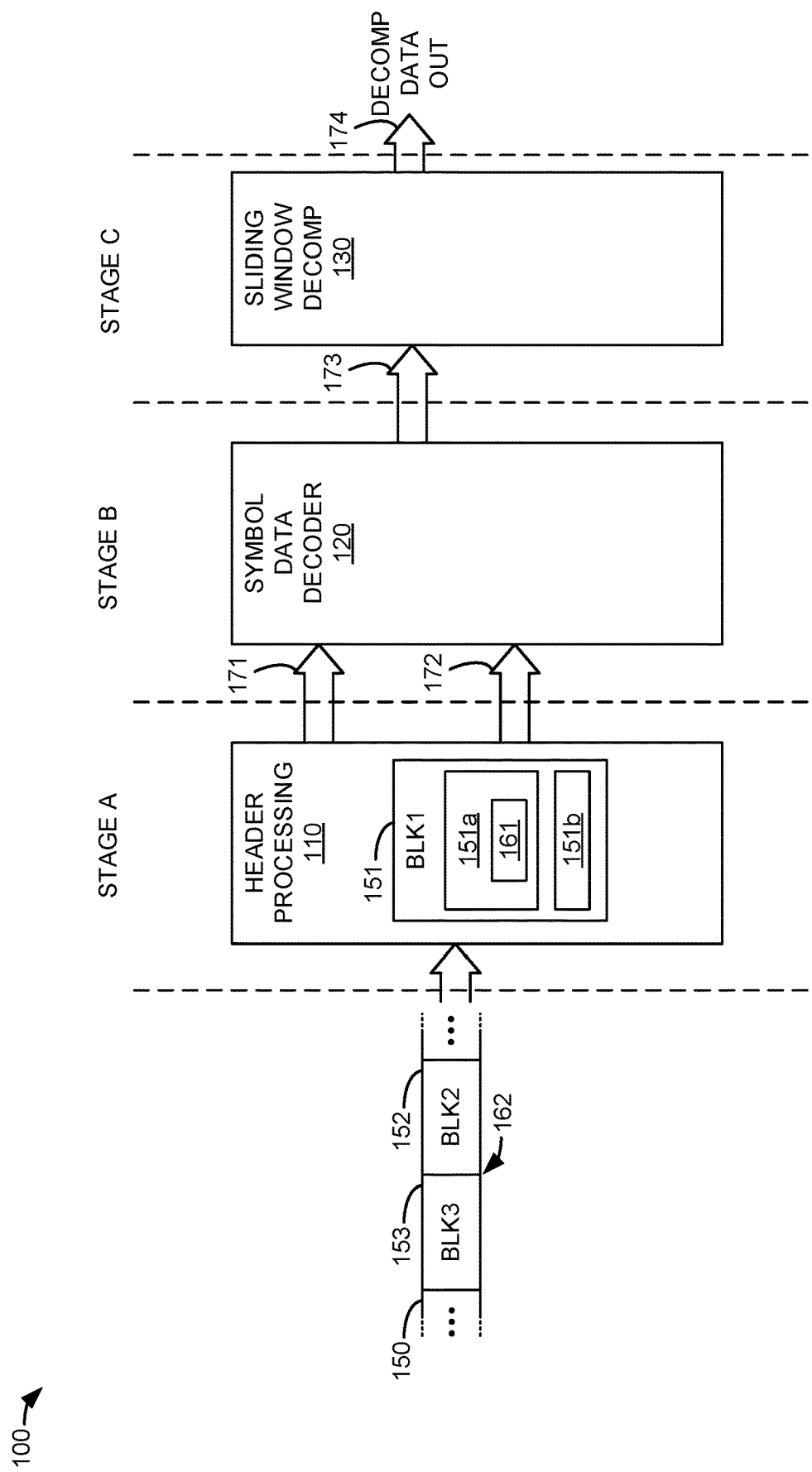
FIG. 1B illustrates block pipeline stages processing a header of a first block of compressed data.

FIG. 1B illustrates block pipeline stages processing a header of a first block of compressed data. FIGS. 1B-1E illustrate the progression of compressed data blocks 151-153 through block piplelne stages A-C. Compressed data block 151 is formatted in accordance with a first data compression scheme that indicates the end of data block 151 in the header 151a of data block 151. Compressed data block 152 is formatted in accordance with a second data compression scheme that indicates the end of data block 151 in the compressed data portion of data block 151 (e.g., with an end-of-block symbol.) In FIG. 1B, compressed data block 151 is being processed by header processing 110. Header processing 110 separates header 151a from compressed data 151b. Header 151a includes end of block indicator 161.

Figure 1C:
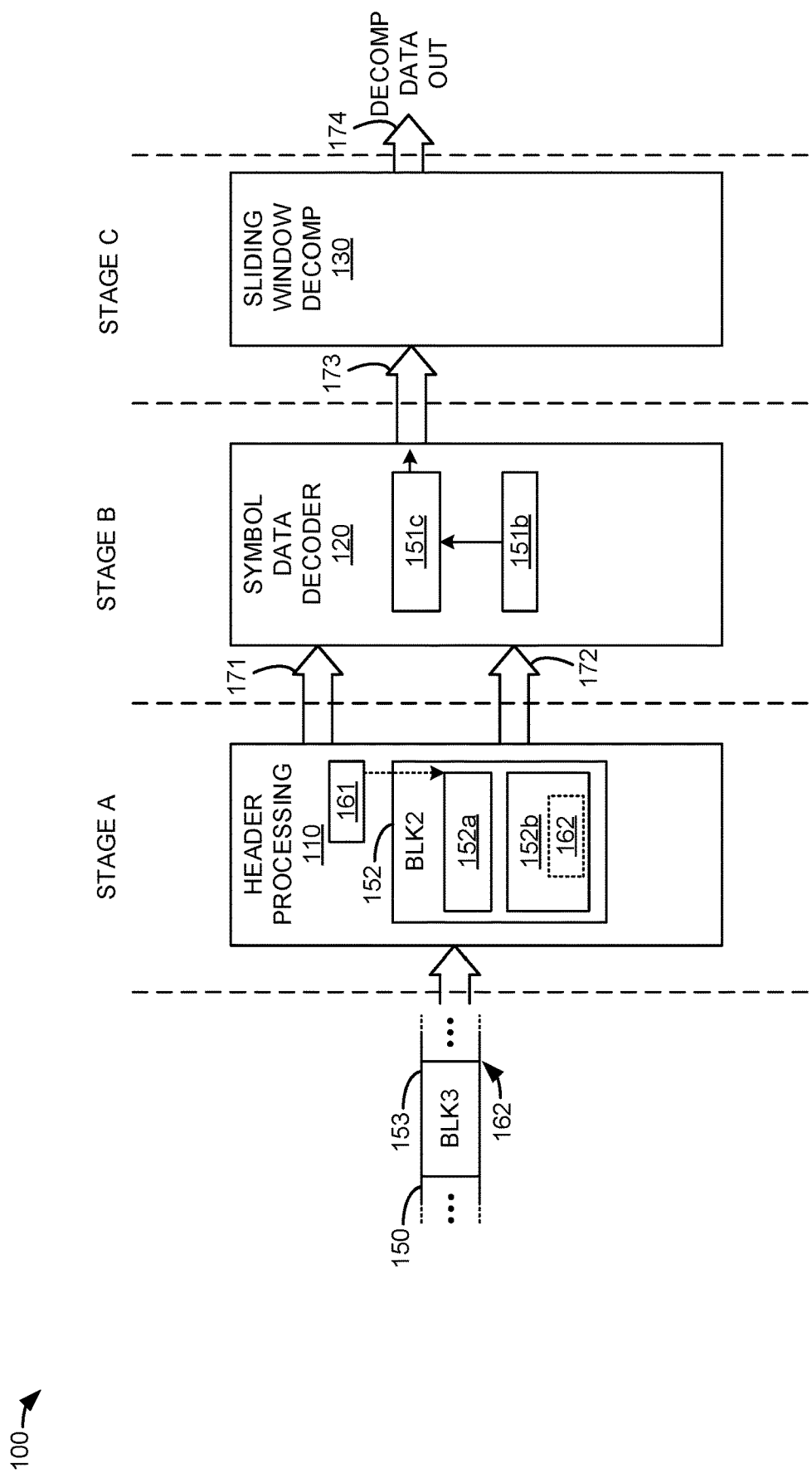
FIG. 1C illustrates block pipeline stages operating to concurrently decode a first block of compressed data and a header of a second block of compressed data.

FIG. 1C illustrates block pipeline stages operating to concurrently decode a first block of compressed data and a header of a second block of compressed data. In FIG. 1C, block information 151c (e.g., Huffman tables, etc.) and compressed data 151b (from compressed data block 151) has been received by symbol data decoder 120. After compressed data block 151 has been processed by header processing 110, and the outputs of header processing 110 have been provided to symbol data decoder 120, symbol data decoder 120 uses block information 151c to decode compressed data 151b. Header processing 110 uses end of block indicator 161 (from header 151a) to determine where in bitstream 150 header 152 begins. Compressed data block 152 is being processed by header processing 110. Header processing 110 separates header 152a from compressed data 152b. Compressed data 152b includes end of block indicator 162. Note that once header processing 110 extracts end of block indicator 161 from header 151a (and finishes processing header 151a), header processing 110 can find the beginning of header 152a in bitstream 150. This allows header processing 110 to start to process compressed data block 152 while compressed data block 151 is being decoded by symbol data decoder 120.

Figure 1D:
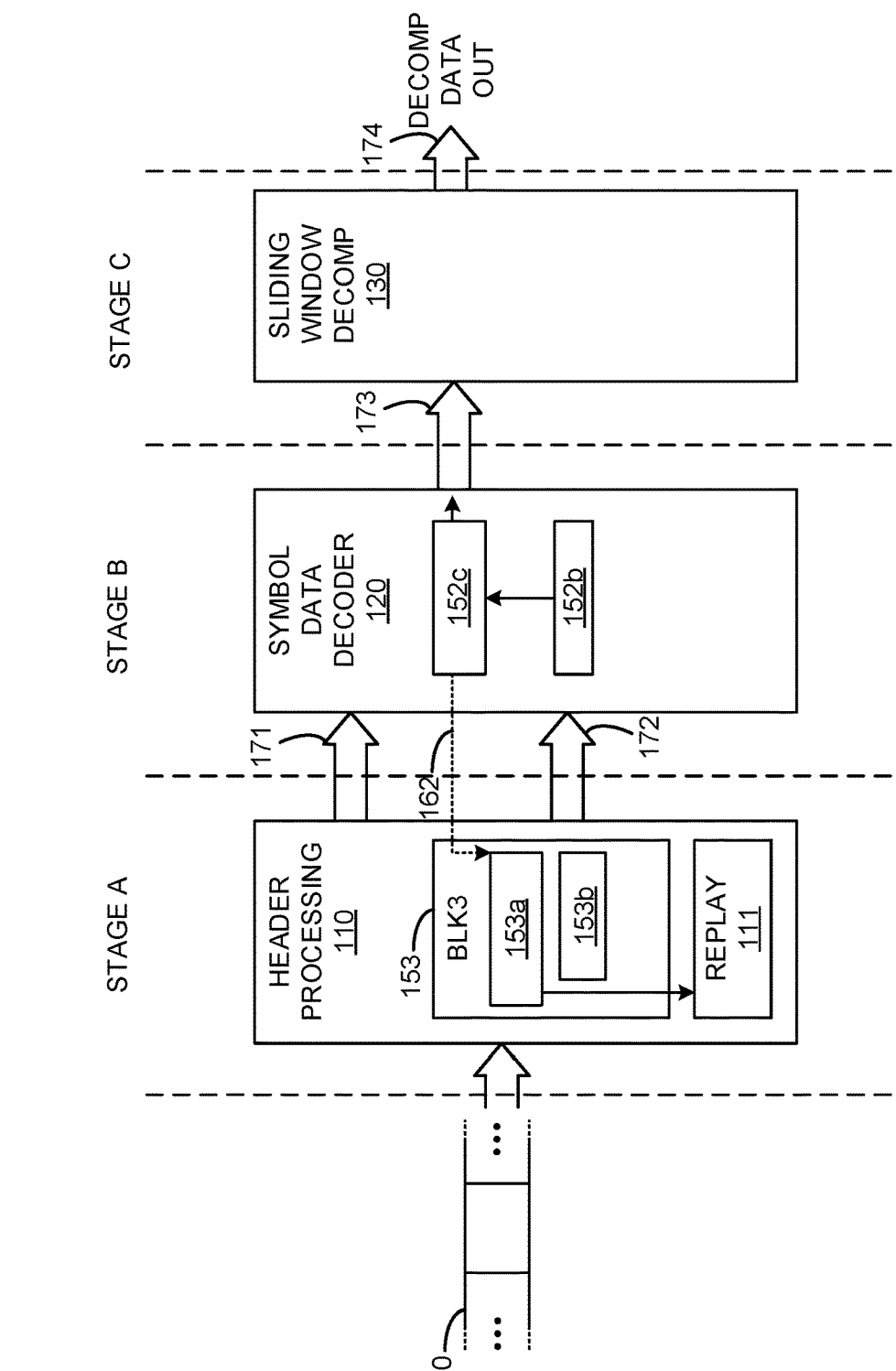
FIG. 1D illustrates block pipeline stages waiting to determine an end of a second block of compressed data.

FIG. 1D illustrates block pipeline stages waiting to determine an end of a second block of compressed data. In FIG. 1D, symbol data decoder 120 is decoding compressed data 152b using block information 152c. Header processing 110 does not effectively process compressed data block 153 until header processing 110 receives end of block indicator 162. Once header processing 110 receives end of block indicator 162 from symbol data decoder 120, header processing 110 can find the beginning of header 153a in bitstream 150 and process header 152a to extract block information.

Note that because header processing 110 does not know where header 153a begins (or equivalently where data block 152 ends) header processor 110 may supply part of header 153a (and/or part of compressed data 153b) to symbol data decoder 120. To ensure this 'extra' data supplied to symbol data decoder 120 is not lost, header processing 110 may copy data from bitstream 150 into a replay buffer 111.

Figure 1E:
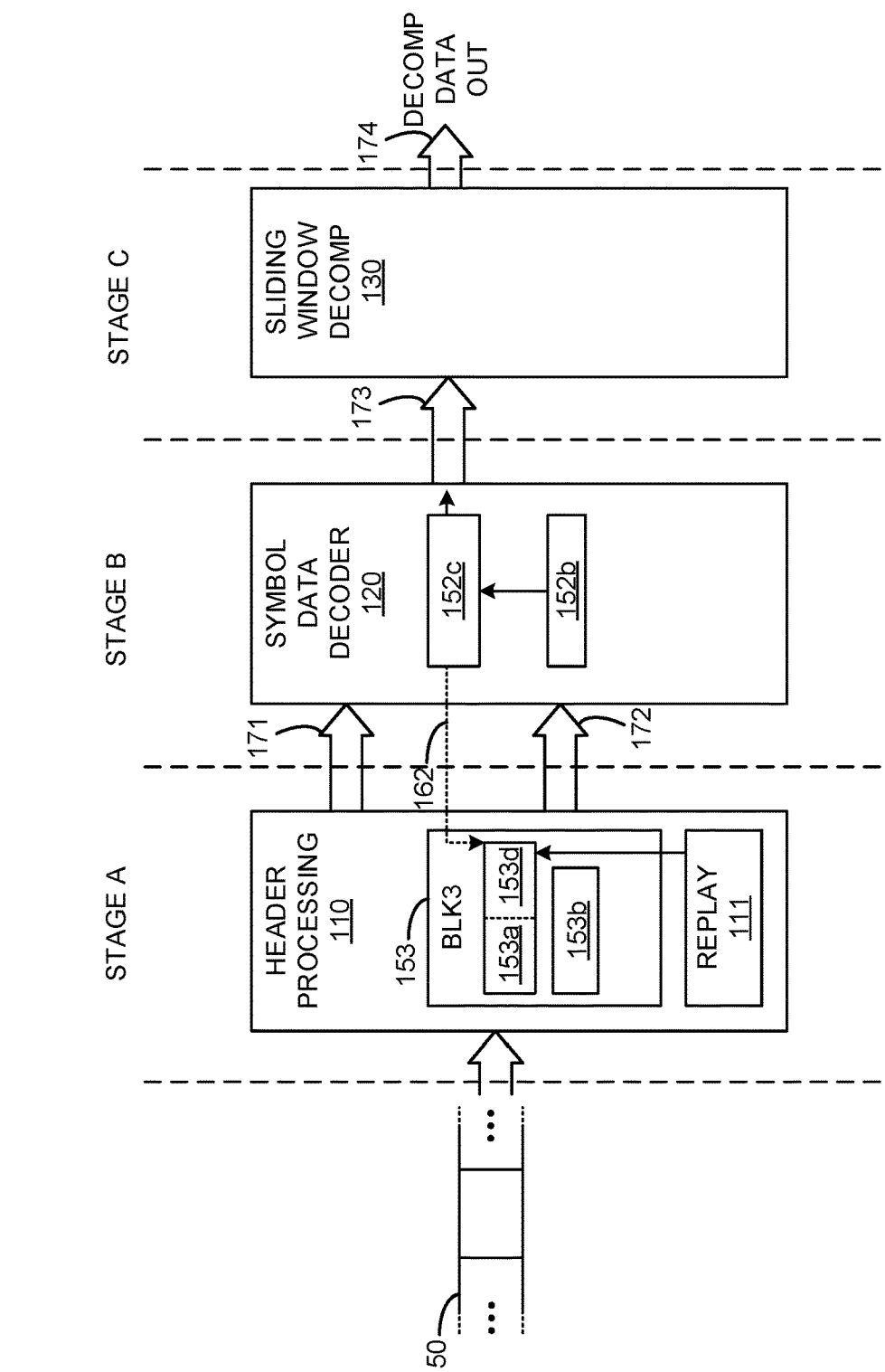
FIG. 1E illustrates block pipeline stages replaying data in order to process a header of a third block of compressed data.

FIG. 1E illustrates block pipeline stages replaying data in order to process a header of a third block of compressed data. In FIG. 1E, once header processing 110 receives end of block indicator 162 from symbol data decoder 120, replay buffer 111 supplies at least a portion 153d of bitstream 150 (e.g., the portion of compressed data block 153 that had already been sent to symbol data decoder 120 before end of block indicator 162 was found by symbol data decoder 120.) If part of compressed data 153b had also already been sent to symbol data decoder 120, replay buffer 111 may re-send that part to symbol data decoder 120.

It should be understood from the foregoing that when symbol data decoder 120 (i.e., stage B) is decoding data compressed in accordance with a data compression scheme that indicates the end of block location in header data, header processing 110 may 'skip ahead' to the beginning of the next compressed data block and begin processing the header of the next data block. Thus, header processing 110 (i.e., stage A) can be operated concurrently with symbol data decoder 120 while symbol data decoder 120 is operating on data compressed in accordance with a data compression scheme that indicates the end of block location in header data. When symbol data decoder 120 (i.e., stage B) is decoding data compressed in accordance with a data compression scheme that indicates the end of block location in the compressed data (rather than in a header), header processing 110 waits for symbol data decoder 120 to finish operating on data compressed in accordance with a data compression scheme that indicates the end of block location in the compressed data.

In an embodiment, block pipeline stages A-C operate to decompress blocks 151-153 of compressed data. These blocks may be compressed according to different compression schemes. For example, block 151 may be compressed using a first compression scheme that specifies the location of the end of block 151 in the header 151a. Block 152 may be compressed using a second compression scheme that specifies the location of the end of block 152 in the compressed data 152b. Based at least in part on block 151 being encoded according to the first compression scheme, the header processing 110 extracts block information 152c from block 152 concurrently with symbol data decoder 120 decoding the compressed data 151b from block 151. Based at least in part on block 152 being encoded according to the second compression scheme, header processing 110 may wait for an indicator of the location of the end of block 152 before header processing 110 extracts block information from block 153.

In an embodiment, header processor 110 may buffer bitstream 150. In particular, replay buffer 111 receives bitstream 150. Header processing 120 receives (over a period of time—i.e., not all at once) the header 151a portion of block 151 and the header 152a portion of block 152. Symbol data decoder 120 receives (over a period of time—i.e., not all at once) the compressed data 151b portion of block 151 and the compressed data 152b portion of block 152. Header processor 110 may use extracted block information 151c (and the type of compression scheme, in particular) to determine whether to process header 152a before symbol data decoder 120 completes decoding compressed data 151b.

Figure 2:
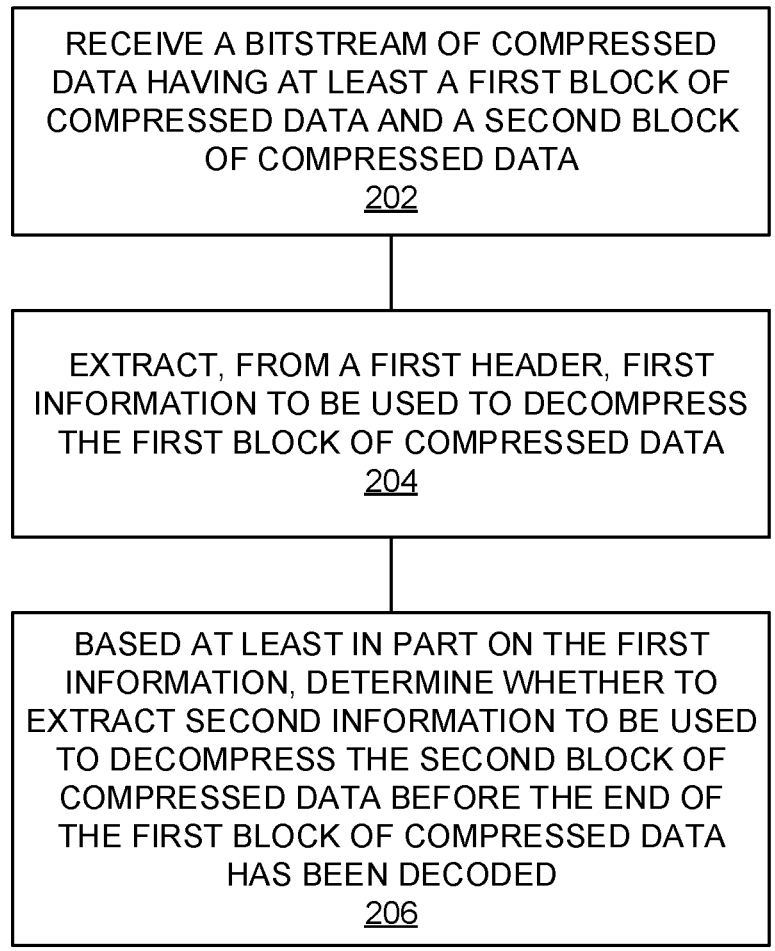
FIG. 2 is a flowchart illustrating a method of operating block pipeline stages.

FIG. 2 is a flowchart illustrating a method of operating block pipeline stages. The steps illustrated in FIG. 2 may be performed, for example, by one or more elements of system 100, and/or its components. A bitstream of compressed data having at least a first block of compressed data and a second block of compressed data is received (202). For example, bitstream 150, which includes compressed data block 151 and compressed data block 152, may be received by header processing 110.

From a first header, first information to be used to decompress the first block of compressed data is extracted (204). For example, header processing 110 may extract block information 151c from block 151. Based at least in part on the first information, it is determined whether to extract second information to be used to decompress the second block of compressed data before the end of the first block of compressed data has been decoded (206). For example, header processing 110 may, based on whether block information 151c (and/or header 151a) included an indicator of the location of the end of block 151, determine whether to process block 152 for block information 152c before symbol data decoder 120 has completed decoding data 151b.

Figure 3:
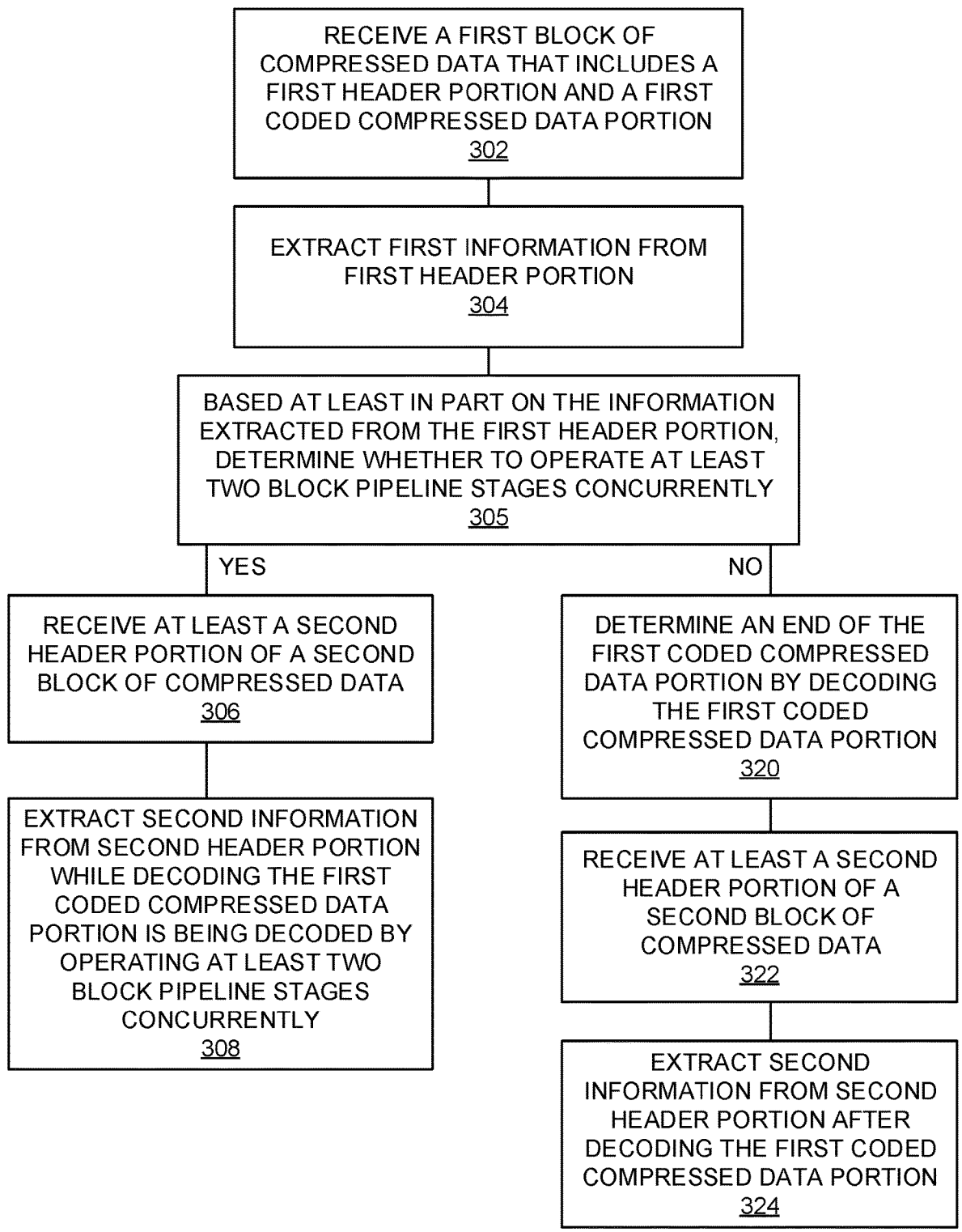
FIG. 3 is a flowchart illustrating a method of extracting information from the header of a compressed data block.

FIG. 3 is a flowchart illustrating a method of extracting information from the header of a compressed data block. The steps illustrated in FIG. 3 may be performed, for example, by one or more elements of system 100, and/or its components. A first block of compressed data that includes a first header portion and a first coded compressed data portion is received (302). For example, header processing 110 may receive compressed data block 151 where compressed data block 151 includes header portion 151a and compressed data portion 151b.

First information is extracted from the first header portion (304). For example, header processing 110 may extract block information 151c from header portion 151a. Based at least in part on the information extracted from the first header portion, it is determined whether to operate at least two block pipeline stage concurrently (305). For example, based on block information 151c, header processing 110 may determine whether to 'skip ahead' and begin processing block 152 while symbol data decoder 120 is concurrently decoding compressed data portion 151b. For example, header processing 110 may determine whether or not to 'skip ahead' based on the type of compression scheme given in block information 151c. In another example, header processing 110 may determine whether or not to 'skip ahead' based on whether block information 151c includes an indicator of the location of the end of block 151 (and therefore the beginning of block 152.)

If it is determined to operate the at least two block pipeline stage concurrently, flow proceeds to block 306. If it is determined not to operate the at least two block pipeline stage concurrently, flow proceeds to block 320.

If it is determined to operate the at least two block pipeline stage concurrently, at least a second header portion of a second block of compressed data is received (306). For example, header processing 110 may receive header 152*a* portion of block 152. Second information from the second header portion is extracted while decoding the first coded compressed data by operating at least two block pipeline stage concurrently (308). For example, header processing 110 may extract block information 152*c* while symbol data decoder 120 is concurrently decoding compressed data portion 152*b* of block 152.

If it is determined not to operate the at least two block pipeline stage concurrently, an end of the first coded compressed data portion is determined by decoding the first coded compressed data portion (320). For example, header processing 110 may wait for an indicator of the location of the end of block 151 while symbol data decoder 120 decodes compressed data portion 151*b* of block 151. When symbol data decoder 120 is finished decoding compressed data portion 151*b*, symbol data decoder 120 may provide header processing 110 with the location of the end of block 151 in bitstream 150.

At least a second header portion of a second block of compressed data is received (322). For example, once header processing 110 knows where to find the start of block 152, header processing 110 may receive header 152*a* portion of block 152. Second information from the second header portion is extracted after decoding of the first coded compressed data portion (324). For example, header processing 110 may extract block information 152*c* after symbol data decoder 120 has found the end of compressed data portion 151*b* of block 151 by completely decoding compressed data portion 151*b*.

Figure 4:
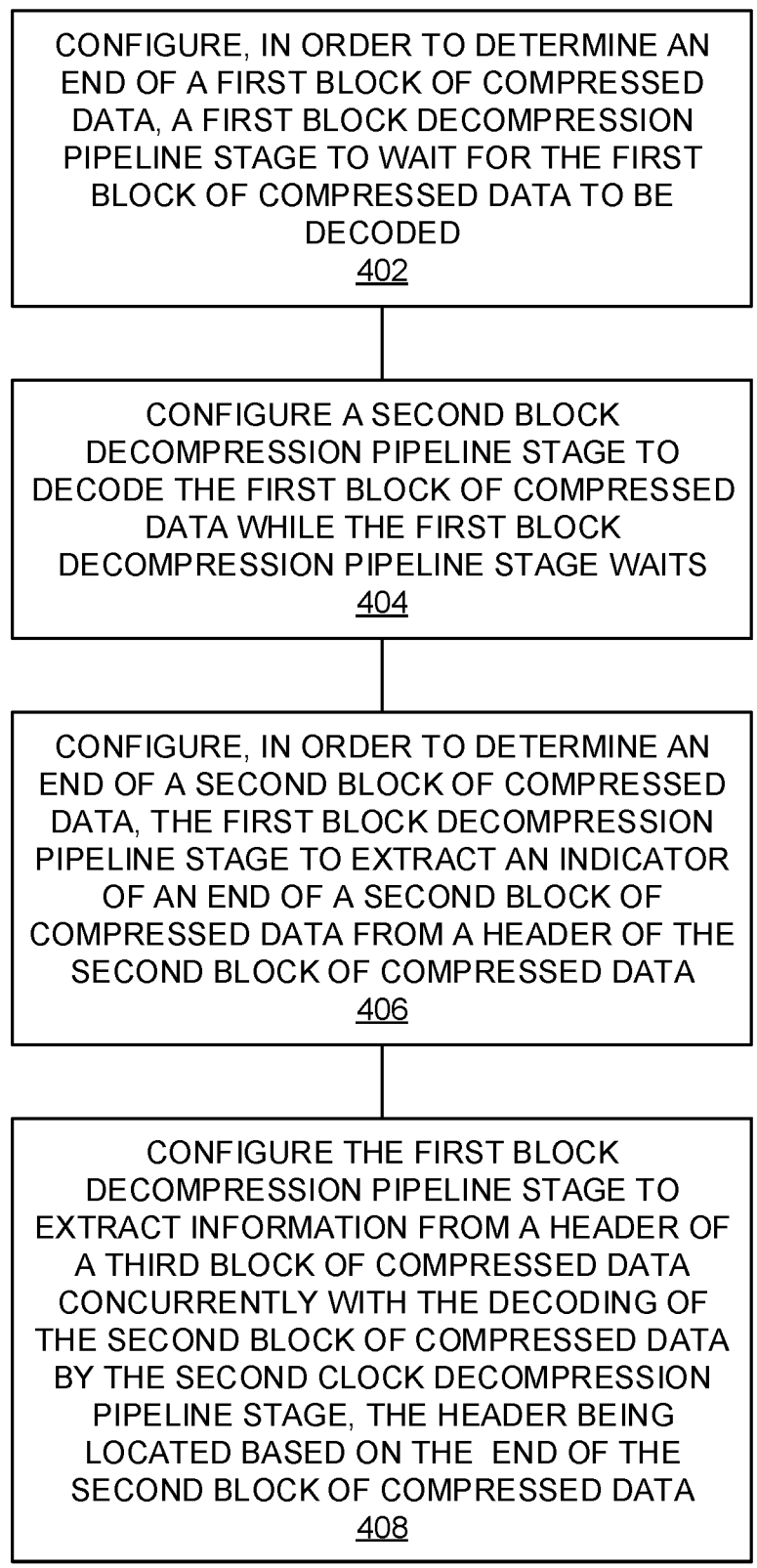
FIG. 4 is a flowchart illustrating a method of configuring block pipeline stages to process the headers of compressed data blocks.

FIG. 4 is a flowchart illustrating a method of configuring block pipeline stages to process the headers of compressed data blocks. The steps illustrated in FIG. 4 may be performed, for example, by one or more elements of system 100, and/or its components. In order to determine an end of a first block of compressed data, a first block decompression pipeline stage is configured to wait for the first block of compressed data to be decoded (402). For example, when the end of block 151 is not otherwise known (e.g., from header 151*a* information) header processing 110 may be configured to wait for block 151 to be decoded by symbol decoder 120 thereby establishing where the end of block 151 is in bitstream 150.

A second block decompression pipeline stage is configured to decode the first block of compressed data while the first block decompression pipeline stage waits (404). For example, when the end of block 151 is not otherwise known (e.g., from header 151*a* information) symbol decoder 120 may be configured to decode block 151, while header processor 110 waits, in order to determine where in bitstream 150 that block 151 ends and to provide that end of block information to header processor 110.

In order to determine an end of a second block of compressed data, the first block decompression pipeline stage is configured to extract an indicator of an end of a second block of compressed data from a header of the second block of compressed data (406). For example, header processing 110 may be configured to extract, from header 152*b*, an end of block indicator 162. Header processing 110 may be configured to extract, from header 152*b*, an end of block indicator 162 based on other information (e.g., compression scheme used to create block 152) in header 152*b*.

The first block decompression pipeline stage is configured to extract information from a header of a third block of compressed data concurrently with the decoding of the second block of compressed data by the second block decompression pipeline stage where the header is located based on the end of the second block of compressed data (408). For example, header processing 110 may be configured to process block 153 concurrently with the decoding of block 152 by symbol data decoder 120.

Figure 5:
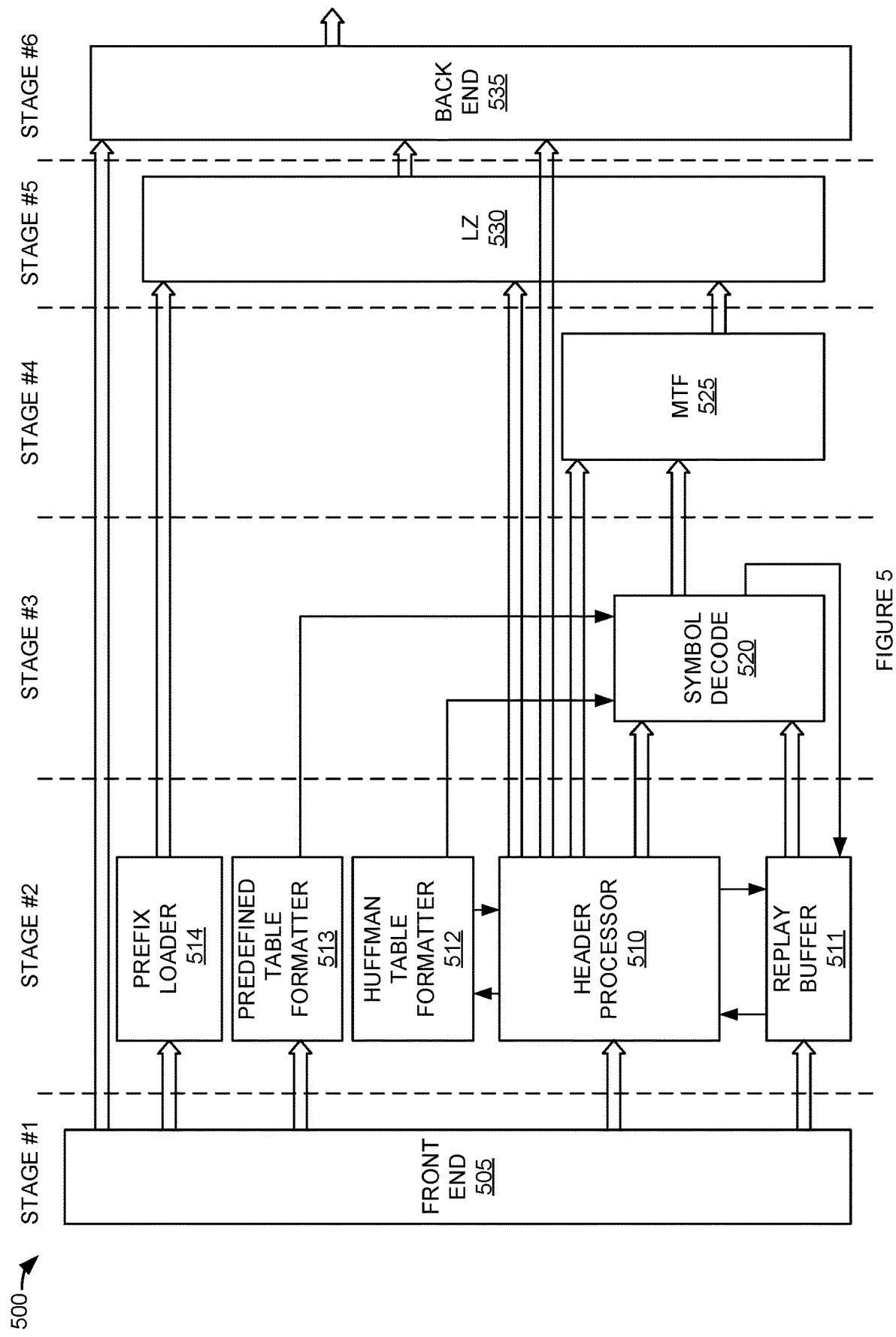
FIG. 5 is a block diagram illustrating block pipeline stages to decompress blocks of compressed data.

FIG. 5 is a block diagram illustrating block pipeline stages to decompress blocks of compressed data. In FIG. 5, system 500 comprises block decompression pipeline stages 1-6. Block decompression pipeline stage #1 includes front end 505. Block decompression pipeline stage #2 includes prefix loader 514, predefined table formatter 513, Huffman table formatter 512, header processor 510, and replay buffer 511. Block decompression pipeline stage #3 includes symbol decoder 520. Block decompression pipeline stage #4 includes move to front circuitry 525. Block decompression pipeline stage #5 includes LZ (a.k.a. sliding window) decompression circuitry 530. Block decompression pipeline stage #6 includes move to back end circuitry 535.

Source data is provided from an external system interface (not shown in FIG. 5) to front end 505. The data provided to front end 505 may consist of a combination of compressed data, system metadata tokens, or raw data to pass through system 500 unmodified. The front end 505 abstracts out the system interface from the core decompressor blocks (e.g., stages #2-#6), parses system-specific metadata/token transactions, identifies raw data, and processes compression file headers for compressed blocks. Front end 505 routes the incoming data to the appropriate interface and communicates frame-level information and settings to the next stages #2-#6 in the pipeline. When processing compressed data, the compressed data blocks are fed into stages #2-#5, which extract block and format settings (stage #2), decode compressed symbols (stage #3), and re-assemble the original source data (stage #5.) Back end 535 arbitrates and re-synchronizes data across its input interfaces. This may include re-associating system level tokens with the corresponding uncompressed data, as well as errors and footer information (if applicable.) Back end 535 also adapts the input interface to the system-specific output data interface.

In an embodiment, front end 505 parses and routes data types presented on its input. These data types may include tokens/metadata, compressed data, prefix data, or raw data (i.e., data to pass to a downstream block). Front end 505 also parses frame-level headers that may be present in compressed data and forwards frame information to downstream blocks (e.g., stages #2-#6.) Prefix loader 514 provides an interface to load prefixes into LZ 530. Prefixes may come from front end 505 and/or an external data storage. Predefined table formatter 513 converts canonical Huffman trees that are described in symbol/bit-length format (i.e., a bit-length table) into a format used by symbol decoder 520. Back end 535 re-synchronizes frames after they have been decompressed with associated tokens/metadata, other raw frame, frame foots, and/or debug/error information.

In an embodiment, header processor 510 parses compression block-level information. This information may include fixed header fields, variable header fields, and compressed Huffman tables. Huffman table formatter 512 may convert one or more bit length tables extracted from block headers (e.g., block headers 151a, 152a, and/or 153a) and produces a table format utilized by symbol decoder 520 and or header processor 510. Whether Huffman table formatter 512 converts zero, one, or more bit length tables depends on the compression scheme. Bitstream replay buffer 511 (which is also functions as a latency compensation FIFO) buffers up the incoming bitstream of compressed data. Replay buffer 511 also re-sends (a.k.a., 'rewinds') data to either header processor 510 and/or symbol decoder 520. Bitstream replay buffer 511 also performs bit-level data-alignment for data provided to header processor 510 and symbol decoder 520.

Symbol decoder 520 parses and decodes symbols out of the bitstream. Symbol decoder 520 may parse and decode multiple symbols per cycle. Symbol decoder 520 also re-packs (or aligns) the symbols for MTF 525 and/or LZ 530. MTF 525 is an optional (i.e., compression scheme dependent) offset cache of pointer offset values. LZ decompressor 530 maintains a history buffer of per frame uncompressed data. LZ 530 unpacks pointer data references and stores and shadows externally defined prefix data (if any.)

System 100 and system 500 use a block level pipelining scheme in which each pipeline stage (e.g., pipeline stages A-C and pipeline stages #1-6) works on data associated with a single data block at a time with the other pipeline stages able to work on different compressed data blocks. These different compressed data blocks may be part of different frames from each other. To handle compression formats that are frame based as well as handling compression formats that are block-based, frame level information output by front end 505 is converted to block level information and treated as such for the remainder of the frame (but held constant for the duration of the frame).

Block information, and equivalently frame information, is sent out of channels from header processor 510 to downstream blocks after the block level header has been processed. This header information is re-synchronized with the incoming data per block then the corresponding data bus indicates a block level boundary (i.e., start of block/frame or end of block/frame).

Switching each pipeline stage to the correct settings for processing each block requires knowing where data blocks start and end. However, the start and end location of compressed blocks in the bitstream is indicated differently for different compression formats. For example, Xpress9 indicates the end location in the block header. Deflate (i.e., the data block format used for at least GZIP and ZLIB) encode the location of the end of a data block in the data as a special Huffman encoded symbol—except for uncompressed data blocks. In the uncompressed data block cases, Deflate indicates the block end in the header.

Extracting a block end location from a header enables the header for the next block to be processed while the remaining data for the current block is still being decoded. Overlapping header and data processing is advantageous when decompressing small frames and/or blocks (in the range of 0-8 k). This is because as the number of cycles to unpack the header can be significant relative to the compressed frame size (e.g., processing the header is in the range of 500-2 k cycles for the Xpress formats—largely due to a long string of data dependencies introduced by heavily compressed Huffman tables). However, when the block's end is encoded in the data, the data for the current block should be fully decoded to know where the next block begins.

For formats where the end of the block location are encoded in the header (e.g., Xpress 9), the following sequence, which is able to concurrently operate header processing and data decoding, may occur: (1) header processor 510 interprets the header for the first block (e.g., this may take around 500-2 k cycles); (2) while header processor 510 works on the header, the data for the first block is buffered in the buffer 511; (3) when header processor 510, Huffman table formatter 512, and predefined table formatter 513 have all completed extracting and distributing their respective information, symbol decoder 520 can (start to) decode the data for the block. Header processor 510 also notifies the buffer 511 of the location of the block's end (in bits); and, (4) when buffer 511 has data that exceeds the known block end location, a secondary read pointer sends data from buffer 511 to header processor 510, and the header for the second block can be processed while the data from the first block is still being streamed from buffer 511 into data decoder 520. In an embodiment, transfers to data decoder 520 and header processor 510 are time-multiplexed. This has little impact on throughput as the data transfers out of buffer 511 are configured to be greater than either interface can take per cycle (both the data and header blocks have small amounts of internal buffering).

For formats where the end of the block location is encoded in the data (e.g., Deflate), the following sequence, which is able to concurrently operate header processing and data decoding, may occur: (1) header processor 510 interprets the header for the first block (e.g., this may take around 500-2 k cycles); (2) while header processor 510 works on the header, the data for the first block is buffered in buffer 511; (3) when header processor 510 has completed its extraction and distribution of block information, symbol decoder 520 can (start to) decode the data for the block; (4) buffer 511 waits on feedback from symbol decoder 520 to determine the location of the end of block; (5) when an end of block symbol has been resolved by data decoder 520, the end location is then fed back to buffer 511 (and/or header processor 510), processing the header for the next block may begin.

Figure 6:
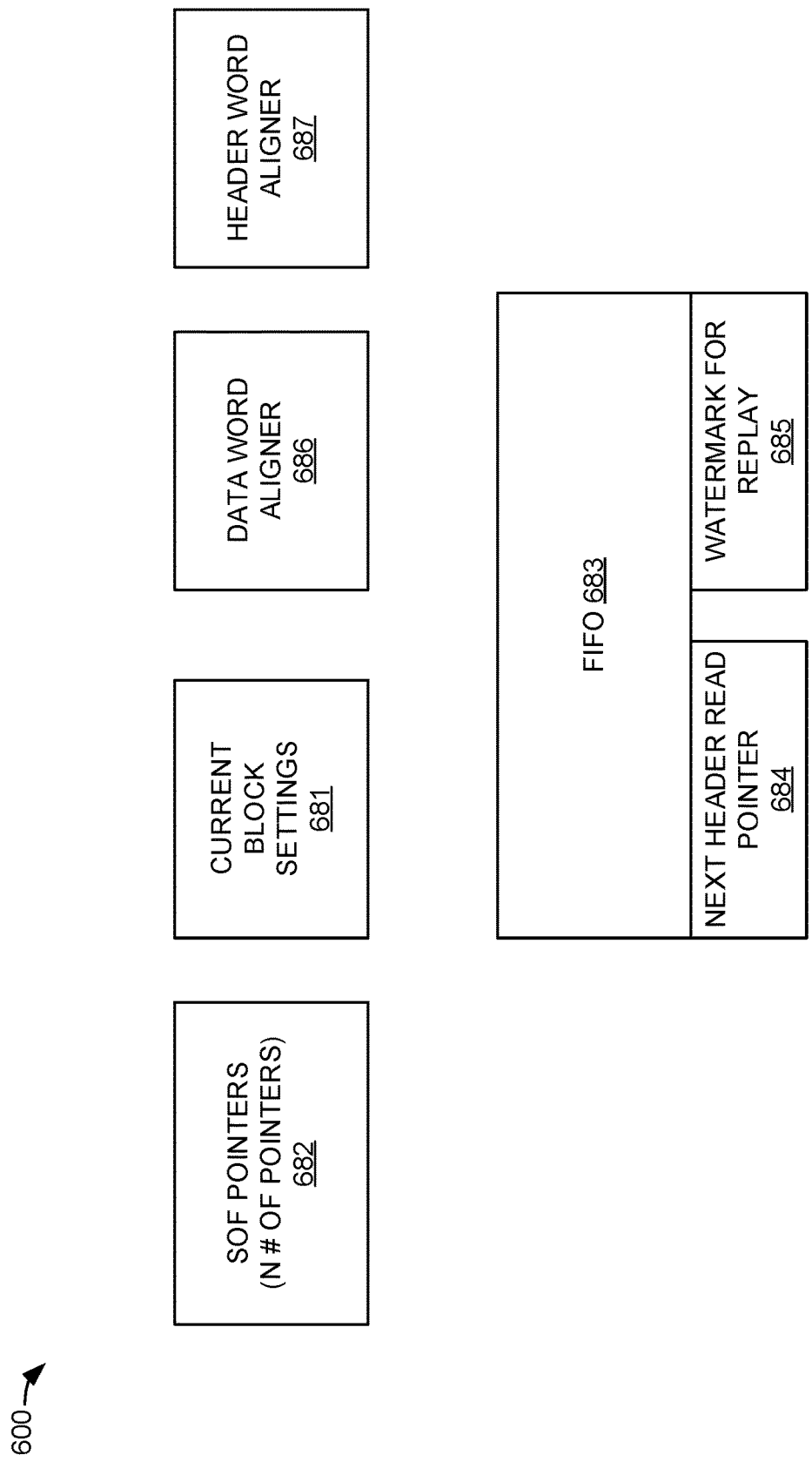
FIG. 6 is a block diagram illustrating a replay buffer.

FIG. 6 is a block diagram illustrating a replay buffer. In FIG. 6, replay buffer 600 comprises current block setting 681, N number of start of frame (SOF) pointers 682, FIFO 683, next header read pointer 684, watermark 685, data word aligner 686, and header word aligner 687. Replay buffer 500 is an example of replay buffer 111 and/or replay buffer 511. In an example, there are four (4) SOF pointers implemented. Other numbers of SOF pointers may be implemented.

Buffer 600 can perform the following functions: (a) latency compensation for header processing (e.g., processing by header processor 510); (b) buffers input data to feed the decoder (e.g., decoder 520) while the block header is being interpreted (e.g., by header processor 510); (c) filters out (i.e., separates) header data from compressed data; (d) aligns the compressed data to the full input width of the downstream blocks; (e) aligns header data for the header processing block (e.g., header processor 510); (f) provides replay functionality for cases when too much data that was not header data was sent to the header processor, or when header data was sent to the data decoder; (g) tracks frame boundary locations within FIFO 683.

In an embodiment, next header read pointer 684 tracks the read location of the header for a subsequent block (when the end of the current block is known). Pointers 682, and 684 have jump capabilities, to adjust to a new location when new information regarding the data stream is obtained (e.g., the location of header or data). Watermark 685 is kept to guarantee a number of bits previously read out are not overwritten. This is for replay functionality because pointers may need to jump backwards during processing. Current block settings 681 are registered that indicate the block format, which ultimately determines where the end of block location will come from (e.g., from header processor 510 or data decoder 520). SOF pointers 682 buffer frame boundaries indicated by the system. The size of the SOF queue determines the number of distinct frames allowed in buffer 600 before back pressuring (a.k.a., flow controlling) the input (the input can also be back pressured if the actual FIFO pointers indicate a full condition). Word aligner 686 for compressed data and word aligner 687 for header data are used to align data from FIFO 683 to fully valid bus transactions that correspond to the widths of the respective processing units. Word aligners 686-687 simply latch a partial entry from FIFO 683 and complete it with the requisite bits from the next FIFO entry. This works on a bit-wise boundary across the supported formats. Headers and compressed data may each start at an arbitrary bit-boundary.

The methods, systems and devices described herein may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 500, buffer 600, and/or their components. These software descriptions may be: behavioral, register transfer, logic component, transistor, and layout geometry-level descriptions.

Data formats in which such descriptions may be implemented are stored on a non-transitory computer readable medium include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Physical files may be implemented on non-transitory machine-readable media such as: 4 mm magnetic tape, 8 mm magnetic tape, 3½-inch floppy media, CDs, DVDs, hard disk drives, solid-state disk drives, solid-state memory, flash drives, and so on.

Alternatively, or in addition, the functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), multi-core processors, graphics processing units (GPUs), etc.

Figure 7:
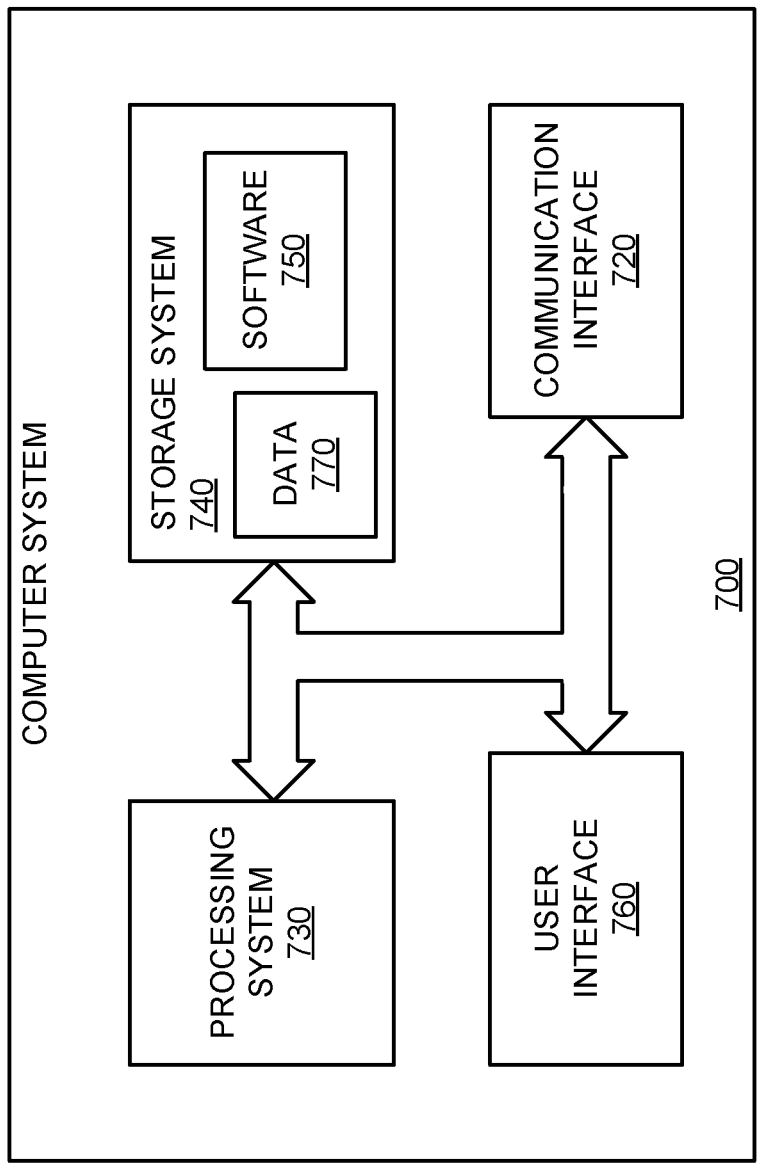
FIG. 7 is a block diagram of a computer system.

FIG. 7 illustrates a block diagram of an example computer system. In an embodiment, computer system 700 and/or its components include circuits, software, and/or data that implement, or are used to implement, the methods, systems and/or devices illustrated in the Figures, the corresponding discussions of the Figures, and/or are otherwise taught herein.

Computer system 700 includes communication interface 720, processing system 730, storage system 740, and user interface 760. Processing system 730 is operatively coupled to storage system 740. Storage system 740 stores software 750 and data 770. Processing system 730 is operatively coupled to communication interface 720 and user interface 760. Processing system 730 may be an example of one or more of system 100, system 300, and/or their components.

Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. User interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, EEPROM, flash memory, network storage, server, or other memory function. Storage system 740 may include computer readable medium. Storage system 740 may be distributed among multiple memory devices.

Processing system 730 retrieves and executes software 750 from storage system 740. Processing system 730 may retrieve and store data 770. Processing system 730 may also retrieve and store data via communication interface 720. Processing system 750 may create or modify software 750 or data 770 to achieve a tangible result. Processing system may control communication interface 720 or user interface 760 to achieve a tangible result. Processing system 730 may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate as described herein.

Implementations discussed herein include, but are not limited to, the following examples:

Example 1

An integrated circuit, comprising: a plurality of block pipeline stages to decompress blocks of compressed data, a first type of compressed block being encoded according to a first compression scheme, a second type of compressed block being encoded according to a second compression scheme; a first block pipeline stage of the plurality of block pipeline stages to operate to extract block information from blocks of compressed data, the block information for the first compression scheme indicating end of block locations, the end of block locations for the second compression scheme not being indicated in the block information for the second compression scheme; and, a second block pipeline stage of the plurality of block pipeline stages to operate to decode compressed data blocks based on respective extracted block information, based at least in part on a first compressed block being encoded according to the first compression scheme, the first block pipeline stage to extract second block information from a second compressed block concurrently with the second block pipeline stage decoding compressed data from the first compressed block.

Example 2

The integrated circuit of example 1, wherein based at least in part on the second compressed block being encoded according to the second compression scheme, the first block pipeline stage is to wait for an indicator of an end of block location for the second compressed block before the first block pipeline stage extracts third block information from a third compressed block.

Example 3

The integrated circuit of example 2, wherein the first block pipeline stage comprises: header processing circuitry to extract the block information from the blocks of compressed data.

Example 4

The integrated circuit of example 3, further comprising: a replay buffer to, based at least in part on the indicator of the end of block location for the second compressed block, provide the header processing circuitry with a portion of the third compressed block.

Example 5

The integrated circuit of example 4, wherein the portion of the third compressed block provided to the header processing circuitry is aligned to header information for the third compressed block.

Example 6

The integrated circuit of example 4, wherein at least a portion of the header information for the third compressed block is decompressed by the header processing circuitry.

Example 7

An integrated circuit to decompress a plurality of data blocks compressed using a respective plurality of data compression schemes, comprising: a buffer to receive a bitstream comprised of a first compressed data block and a second compressed data block, the first compressed data block comprising, according to a first data compression scheme, a first header portion and a first compressed data portion, the second compressed data block comprising, according to a second data compression scheme, a second header portion and a second compressed data portion; a header processor to receive, from the buffer, the first header portion and the second header portion; a symbol data decoder to receive, from the buffer, the first compressed data portion and the second compressed data portion; the header processor to determine, based at least in part on the first compression scheme, whether the second header portion is to be processed by the header processor before the symbol data decoder has completed decoding the first compressed data portion.

Example 8

The integrated circuit of example 7, wherein the first compression scheme indicates at least one end of block location in the first header portion.

Example 9

The integrated circuit of example 8, wherein, based on the at least one end of block location that is indicated by the first header portion, the buffer selects, from the bitstream, the second header portion to be provided to the header processor.

Example 10

The integrated circuit of example 9, wherein the header processor extracts block information from the second header portion concurrently with the symbol data decoder decoding the first compressed data portion.

Example 11

The integrated circuit of example 7, wherein the first compression scheme indicates at least one end of block location in the first compressed data portion.

Example 12

The integrated circuit of example 11, wherein, based on the at least one end of block location that is indicated by the first compressed data portion, the buffer selects, from the bitstream, the second header portion to be provided to the header processor.

Example 13

The integrated circuit of example 12, wherein, based at least in part on the first compression scheme, the header processor extracts block information from the second header portion after the symbol data decoder decodes the first compressed data portion.

Example 14

The integrated circuit of example 7, wherein Huffman decode table information associated with the second compressed data block is provided to the symbol data decoder by the header processor prior to the symbol data decoder operating to decode the second compressed data portion.

Example 15

The integrated circuit of example 7, wherein the first compression scheme and the second compression scheme correspond to sliding window compression schemes.

Example 16

The integrated circuit of example 15, further comprising: a sliding window decompressor to receive decoded symbols corresponding to the first and second compressed data portions.

Example 17

A method of operating an integrated circuit, comprising: receiving a bitstream of compressed data comprising a first block of compressed data and a second block of compressed data, the first block of compressed data having been compressed in accordance with a first data compression scheme, the second block of compressed data having been compressed in accordance with a second data compression scheme, the first block comprising a first header and first compressed data, the second block comprising a second header and second compressed data; extracting first information to be used to decompress the first compressed data from the first header; and, based at least in part on the first information, determining whether to extract second information to be used to decompress the second compressed data before the end of the first compressed data has been decoded using the first information.

Example 18

The method of example 17, further comprising: before the end of the first compressed data has been decoded using the first information, extracting, from the second header, second information to be used to decompress the second compressed data.

Example 19

The method of example 17, further comprising: after the end of the first compressed data has been decoded using the first information, extracting, from the second header, second information to be used to decompress the second compressed data.

Example 20

The method of example 17, wherein, based at least in part on a characteristic of the first data compression scheme, a location in the bitstream of compressed data where the second header begins is dependent at least in part on the end of the first compressed data in the bitstream.

The foregoing descriptions of the disclosed embodiments have been presented for purposes of illustration and description. They are not intended to be exhaustive or to limit the scope of the claimed subject matter to the precise form(s) disclosed, and other modifications and variations may be possible in light of the above teachings. The embodiments were chosen and described in order to best explain the principles of the disclosed embodiments and their practical application to thereby enable others skilled in the art to best utilize the various embodiments and various modifications as are suited to the particular use contemplated. It is intended that the appended claims be construed to include other alternative embodiments except insofar as limited by the prior art.

What is claimed is:

1. An integrated circuit to decompress a plurality of data blocks compressed using a respective plurality of data compression schemes, comprising:
   a buffer to receive a bitstream comprised of a first compressed data block and a second compressed data block, the first compressed data block comprising, according to a first data compression scheme, a first header portion and a first compressed data portion, wherein the first data compression scheme indicates a location of an end of the first compressed data block in the first header portion, the second compressed data block comprising, according to a second data compression scheme, a second header portion and a second compressed data portion;
   a header processor to receive, from the buffer, the first header portion and the second header portion;
   a symbol data decoder to receive, from the buffer, the first compressed data portion and the second compressed data portion; and,
   based at least in part on the first data compression scheme indicating the location of the end of the first compressed data block in the first header portion, the header processor to process the second header portion before the symbol data decoder has completed decoding the first compressed data portion, wherein the header processor extracts block information from the second header portion concurrently with the symbol data decoder decoding the first compressed data portion.

2. The integrated circuit of claim 1, wherein, based on the first data compression scheme indicating the end of the first compressed data block in the first header portion, at least one end of block location that is indicated by the first header portion, the buffer selects, from the bitstream, the second header portion to be provided to the header processor.

3. The integrated circuit of claim 1, wherein the first data compression scheme indicates at least one end of block location in the first compressed data portion.

4. The integrated circuit of claim 3, wherein, based on the at least one end of block location that is indicated by the first compressed data portion, the buffer selects, from the bitstream, the second header portion to be provided to the header processor.

5. The integrated circuit of claim 4, wherein, based at least in part on the first data compression scheme, the header processor extracts block information from the second header portion after the symbol data decoder decodes the first compressed data portion.

6. The integrated circuit of claim 1, wherein Huffman decode table information associated with the second compressed data block is provided to the symbol data decoder by the header processor prior to the symbol data decoder operating to decode the second compressed data portion.

7. The integrated circuit of claim 1, wherein the first data compression scheme and the second data compression scheme correspond to sliding window compression schemes.

8. The integrated circuit of claim 7, further comprising:
   a sliding window decompressor to receive decoded symbols corresponding to the first and second compressed data portions.

9. A method of operating an integrated circuit, comprising:
   receiving a bitstream of compressed data comprising a first block of compressed data and a second block of compressed data, the first block of compressed data having been compressed in accordance with a first data compression scheme, the second block of compressed data having been compressed in accordance with a second data compression scheme, the first block comprising a first header and first compressed data, wherein the first data compression scheme indicates a location of an end of the first block of compressed data in the first header, the second block comprising a second header and second compressed data;
   extracting first information to be used to decompress the first compressed data from the first header; and,
   based at least in part on the first information and the first data compression scheme indicating the location of the end of the first block of compressed data in the first header, extracting second information from the second header to be used to decompress the second compressed data before the end of the first compressed data has been decoded using the first information, wherein the second information is extracted concurrently with the first compressed data being decoded.

10. The method of claim 9, further comprising:
after the end of the first compressed data has been decoded using the first information, extracting, from the second header, second information to be used to decompress the second compressed data.

11. The method of claim 9, wherein, based at least in part on a characteristic of the first data compression scheme, a location in the bitstream of compressed data where the second header begins is dependent at least in part on the end of the first compressed data in the bitstream.

* * * * *